United States Patent

Lu et al.

[11] Patent Number: 6,100,573
[45] Date of Patent: Aug. 8, 2000

[54] STRUCTURE OF A BONDING PAD FOR SEMICONDUCTOR DEVICES

[75] Inventors: Chang-Ming Lu, Taoyuan Hsien; Shu-Ying Lu, Hsinchu Hsien, both of Taiwan

[73] Assignee: United Integrated Circuits Corp., Hsinchu, Taiwan

[21] Appl. No.: 09/136,544

[22] Filed: Aug. 19, 1998

[30] Foreign Application Priority Data

Jun. 3, 1998 [TW] Taiwan .................. 87208738

[51] Int. Cl.[7] .................. H01L 29/00; H01L 23/48
[52] U.S. Cl. .................. 257/508; 257/753; 257/758; 257/765
[58] Field of Search .................. 257/758, 760, 257/765, 508, 771, 774, 776, 752, 753

[56] References Cited

U.S. PATENT DOCUMENTS 5,847,466  12/1998  Ito et al. .................. 257/758
5,923,088   7/1999  Shiue et al. .................. 257/758

*Primary Examiner*—Minh Loan Tran
*Attorney, Agent, or Firm*—Thomas, Kayden, Horstemeyer & Risley

[57] ABSTRACT

The invention provides a structure of a bonding pad, which comprising: a substrate; a dielectric layer formed over the substrate; a first metal layer formed in the dielectric layer; a second metal layer formed in the dielectric layer and above the first metal layer; a plurality of first plugs formed between the first metal layer and the second metal layer, wherein the plugs are used for connecting the first metal layer with the second metal layer; a third metal layer formed over the dielectric layer; and a plurality of second plugs, formed between the second metal layer and the third metal layer, wherein the second plugs are used for connecting the second metal layer with the third metal layer.

19 Claims, 4 Drawing Sheets

STRUCTURE OF A BONDING PAD FOR SEMICONDUCTOR DEVICES

CROSS-REFERENCE TO RELATED APPLICATION

This application claims the priority benefit of Taiwan application serial no. 87208738, filed Jun. 3, 1998, the full disclosure of which is incorporated herein by reference.

BACKGROUND OF THE INVENTION

1. Field of the Invention

This invention relates to a structure of an integrated circuit, and more particularly, to a structure of an integrated circuit providing a connection of metal lines in the integrated circuit, by which can reduce the stress and adhesion generated by the metal lines of the multi-layered structure of the integrated circuit.

2. Description of Related Art

During the fabricating process of the integrated circuit, bonding pads are commonly formed for interface between an internal circuit of the integrated circuit and an external circuit. By the formed bonding pads and the metal plugs formed in dielectric layers, the external circuit can make electrical connection with the internal circuit of the integrated circuit.

Referring to FIG. 1, it shows a cross-sectional view of a conventional structure of the bonding pad and the internal circuit in the integrated circuit. An internal circuit area 110 and a bonding pad area 120 are simultaneously formed on the substrate 100. The structure comprises a field oxide layer 10, a gate oxide layer 11, a gate 12, source/drain regions 13, oxide layer 14, a first metal layer 16, a inter metal dielectric layer 17 and a second metal layer 18.

The portion of the second metal layer 18 in the bonding area 120 is used for a bonding pad, by which the external circuit (not shown) can electrically connected to the internal circuit area 110 through via 19. In addition, for avoiding the first metal layer 16 punches through the conjunction of the source/drain region 13 to cause the leakage effect, a barrier layer 15 is formed under the first metal layer 16 to serve as a barrier. The barrier layer 15 is composed of, for example, titanium, TiN or TiW. If adhesion between the barrier layer 15 and the oxide layer 14 served as a isolation layer is bad, and a coefficient of expansion of the metal layer is different from that of the oxide layer, stress is generated in the following manufacturing process, and then peel phenomenon is introduced in this area.

Some technique for reducing the generated stress and the peel phenomenon is developed in the prior art, in which provides a different layout and design structure. As described in U.S. Pat. No. 5,700,735, it provides a structure of a bonding pad for increasing the adhesion for avoiding peeling. The other conventional technique is shown in FIGS. 2A–2C, which discloses a multi-layered structure for reducing stress generated therebetween.

Referring to FIG. 2A, it shows a cross-sectional view of a structure of a bonding pad in a device. The first metal pad 34 is formed over a first dielectric layer 40 and covered by a second dielectric layer 44. The second metal pad 32 is formed over the second dielectric layer 44 and covered by the third dielectric layer 48. The third metal pad is formed over the third dielectric layer 48 and surrounded by the forth dielectric layer 52. A plurality of first plugs 38 are formed between the first metal pad 34 and the second metal pad 32. A plurality of second plugs 36 are formed between the second metal pad 34 and the third metal pad 30. For testing the stress generated in the multiple layers, a test fixture 20 is connected to the third metal pad 30. The test fixture 20 can be used for testing either a tensile force 22 or a shear force 24.

As above-described structure, the real structure in the device is not so smooth as shown in FIG. 2A. The location of the first plugs 38 is relatively rotated 45 degrees compared with the location of the second plugs 36, which the first plugs 38 and the second plugs 36 are staggered to each other. It can avoid the situation that the plug can not contact the metal pad. In addition, the above-described structure can not solve the problem caused by the stress between the metal layer and the oxide layer which serves as the dielectric layer, that is, the peeling problem still exists. The peeling problem is mainly caused by the stress generated in the interface during the following fabricating process. A method that can eliminate the phenomenon is improving the design of the structure to release the generated stress.

Referring to FIG. 2B, it shows a cross-sectional top view of the second plugs 38 in a direction indicated by a dash line 2B–2B' shown in FIG. 2A. The cross-sectional view of the first plugs 36 are represented by a dash line 2C–2C'.

SUMMARY OF THE INVENTION

It is therefore an objective of the present invention to provide a structure of a bonding pad, which can reduce the generated stress generated in the following fabricating process.

It is another an objective of the present invention to provide a structure of a bonding pad, which can eliminate the peel phenomenon caused by stress.

In accordance with the foregoing and other objectives of the present invention, the invention provides a structure of a bonding pad, which comprising: a substrate; a dielectric layer formed over the substrate; a first metal layer formed in the dielectric layer; a second metal layer formed in the dielectric layer and above the first metal layer; a plurality of first plugs formed between the first metal layer and the second metal layer, wherein the plugs are used for connecting the first metal layer with the second metal layer; a third metal layer formed over the dielectric layer; and a plurality of second plugs, formed between the second metal layer and the third metal layer, wherein the second plugs are used for connecting the second metal layer with the third metal layer.

In accordance with the foregoing and other objectives of the present invention, the invention provides a structure of a bonding pad formed in a substrate, wherein an internal circuit is formed in the substrate, wherein the structure comprising: a dielectric layer formed over the substrate; a first metal layer formed in the dielectric layer, wherein a plurality of first openings are formed in the first metal layer, whereby the first openings are filled with the dielectric layer; a second metal layer formed in the dielectric layer and above the first metal layer, wherein a plurality of second openings are formed in the second metal layer, whereby the second openings are filled with the dielectric layer; a plurality of first plugs, formed between the first metal layer and the second metal layer, wherein the plugs are used for connecting the first metal layer with the second metal layer; a third metal layer, formed over the dielectric layer; and a plurality of second plugs, formed between the second metal layer and the third metal layer, wherein the second plugs are used for connecting the second metal layer with the third metal layer.

In conclusion, the invention provides a plurality of openings formed in the metal layer are filled with dielectric materials, which jam the metal layer in order to increase the adhesion of the metal layer. The peeling phenomenon is eliminated by openings formed in the metal layer to release the stress caused in the following fabricating process.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
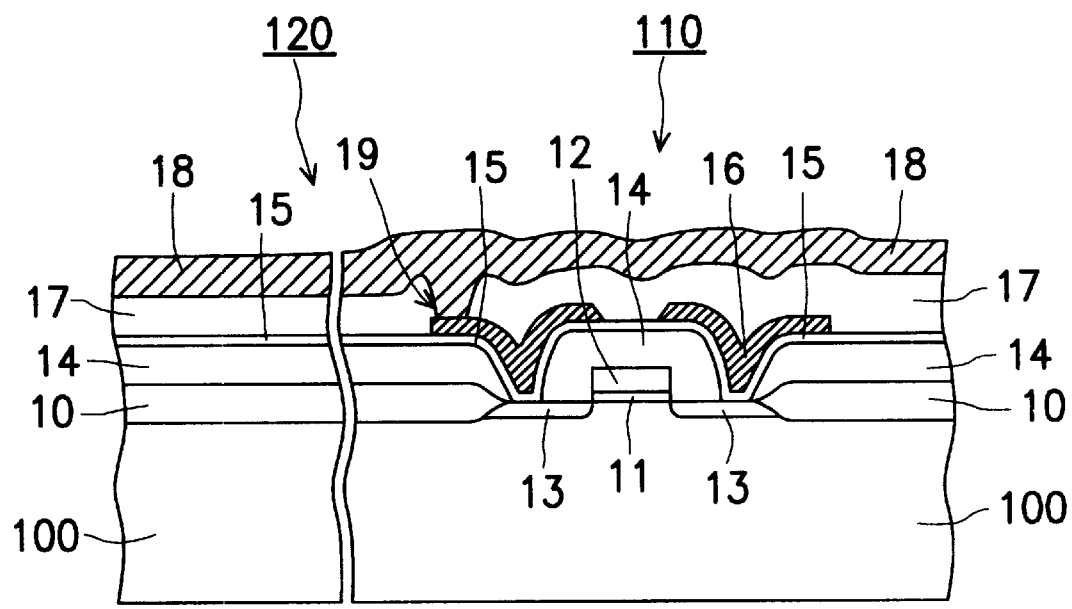
FIG. 1 is a cross-sectional view of a conventional structure of the bonding pad and the internal circuit in the integrated circuit.
Figure 2A:
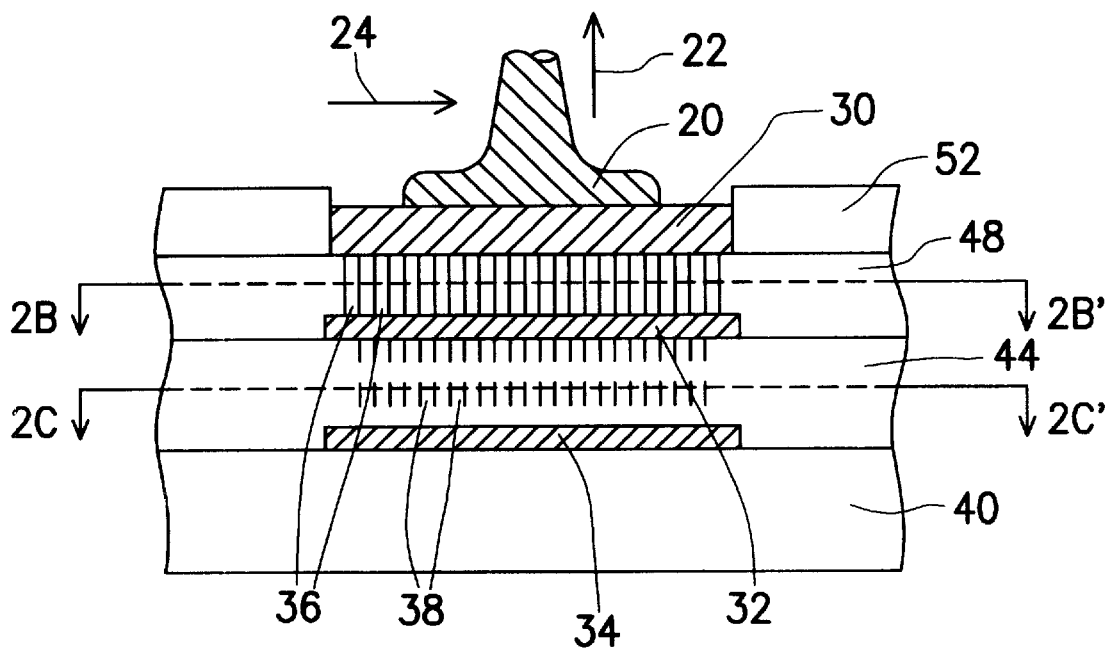
FIGS. 2A–2C are cross-sectional views of a conventional multi-layered structure for reducing stress generated therebetween.
Figure 2B:
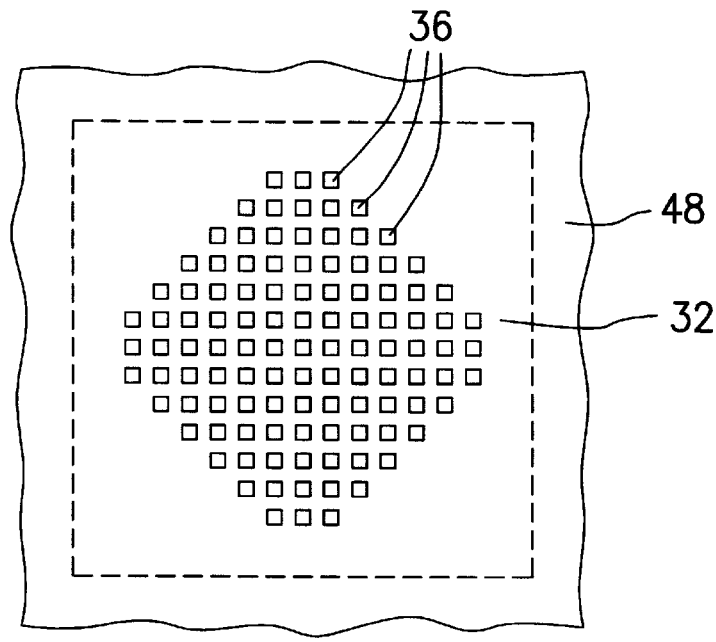
Figure 2C:
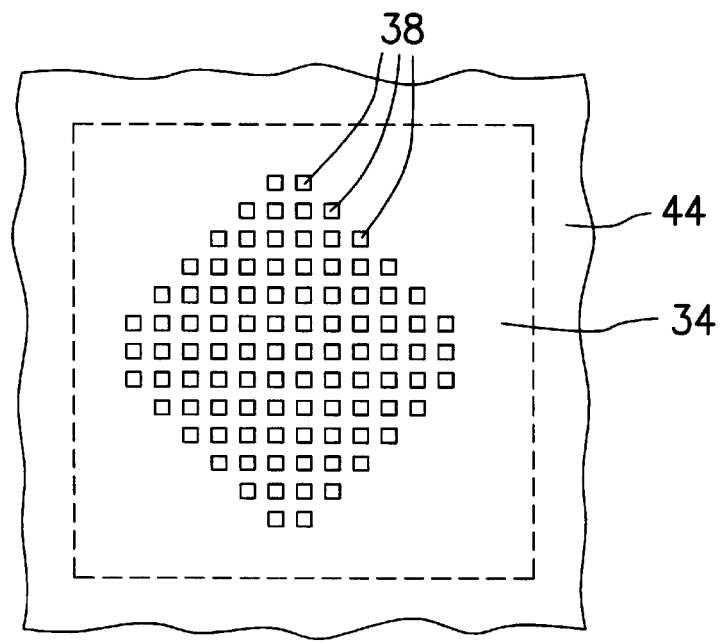
Figure 3A:
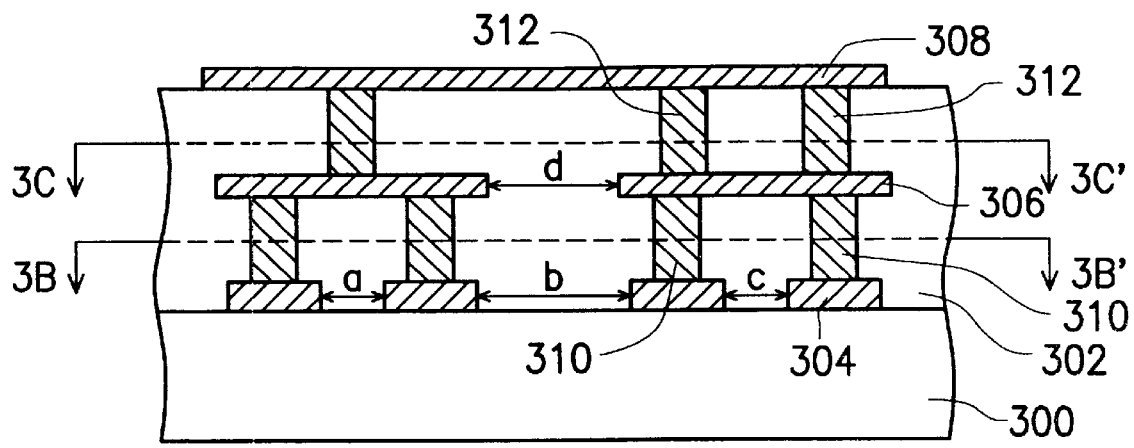
FIGS. 3A–3D are cross-sectional views of a structure of a bonding pad according to a preferred embodiment of the invention.

Referring to FIG. 3A, it shows a cross-sectional view of a structure of a bonding pad according to a preferred embodiment of the invention. An insulation material such as a dielectric layer 302 is formed over a substrate 300, wherein an internal circuit (not shown) is formed in the substrate 300. The dielectric layer 302 is, for example, a silicon oxide layer. A first metal layer 304 and a second metal layer 306 are formed in the dielectric layer 302. A third metal layer 308 is formed over the dielectric layer 302.

A plurality of plugs 310 are formed between the first metal layer 304 and the second metal layer 306. The plugs 310 make the first metal layer 304 electrically connect with the second metal layer 306. A plurality of plugs 312 are formed between the second metal layer 306 and the third metal layer 308. The plugs 312 make the second metal layer 306 electrically connect with the third metal layer 308. The composed materials of the first metal layer 304, the second metal layer 306 and the third metal layer 308 are, for example, aluminium, alloy of aluminium or alloy of aluminium and copper.

In this embodiment, openings are formed in every metal layer, for example, as shown in FIG. 3A, opening a, opening b and opening c are formed in the first metal layer 304, resulting with a plurality of first metal layers 304 separated by the dielectric layer 302. Opening d is formed in the second metal layer 306, resulting with a plurality of second metal layers 306 separated by the dielectric layer 302. For easily being understood about the design of the embodiment, hereinafter some cross-sectional views of the metal layer are described in details.

Figure 3B:
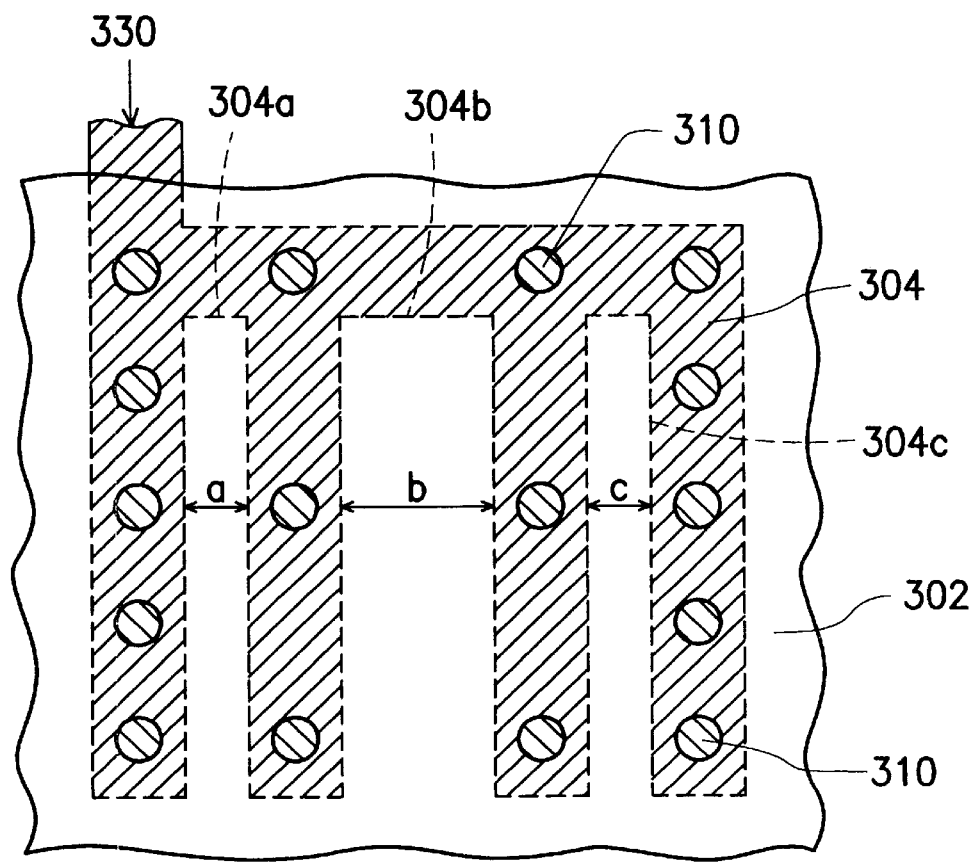
Figure 3C:
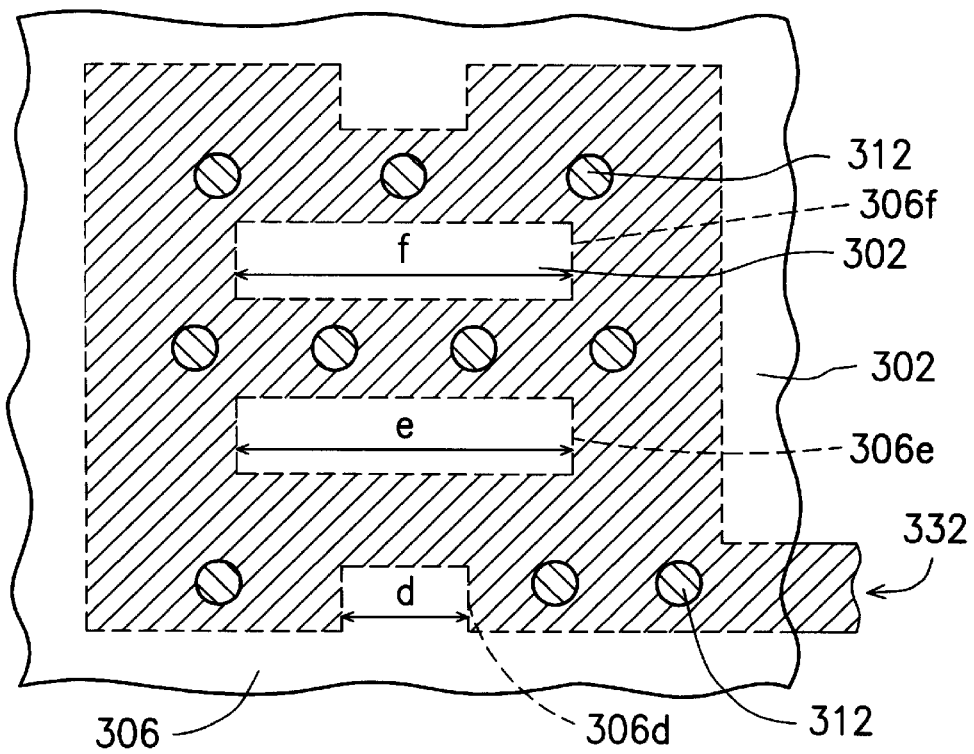
Figure 3D:
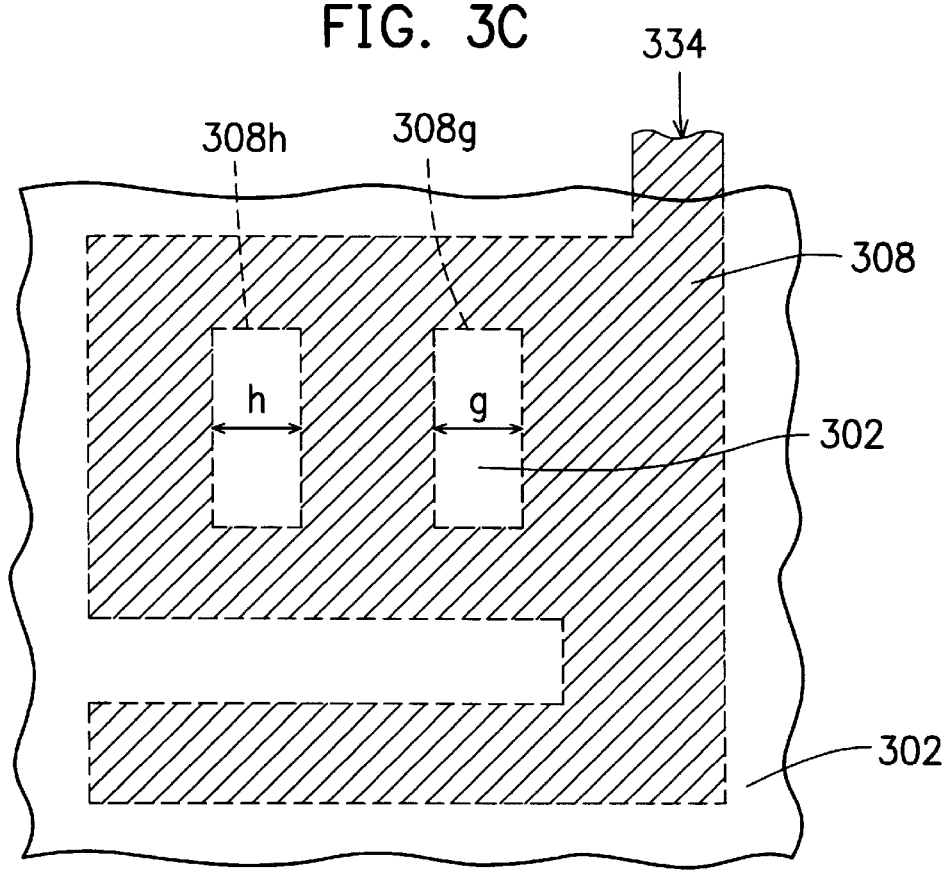

Referring to FIG. 3B, it shows a cross-sectional top view of the first plugs 310 in a direction indicated by a dash line 3B–3B' shown in FIG. 3A. Referring to FIG. 3C, it shows a cross-sectional top view of the first plugs 312 in a direction indicated by a dash line 3C–3C' shown in FIG. 3A. Referring to FIG. 3D, it shows a partial cross-sectional top view of the structure shown in FIG. 3A.

In FIG. 3B, the first metal layer 304 is located in the dielectric layer 302 and under the first plugs 310. Therefore, oblique lines as shown in FIG. 3B represent the first metal layer 304. The denotation 330 represents a position to which the external signal is inputted or outputted, such as a power signal, a ground signal, or an input/output signal. The opening a, b and c are clearly shown in FIG. 3B.

In FIG. 3C, a denotation 332 represents a position to which the external signal is inputted or outputted. Because the second metal layer 306 is covered by the dielectric layer 302, the second metal layer 306 is represented by oblique lines, which is electrically connected with the third metal layer 308 through the second plugs 312. The dash lines 306d, 306e and 306f respectively define the opening d, e and f.

In FIG. 3D, a denotation 330 represents a position to which the external signal is inputted or outputted. Openings g and h are formed in the third metal layer 308, wherein the opening g and h are respectively defined by dash lines 308g and 308h.

The shapes of first metal layer 304 and the second metal layer 306 are designed to make the two metal layers connected with each other through the plugs formed therebetween, that is, the two ends of the plug can respectively contact the two metal layers. A plurality of openings formed in the metal layer are filled with dielectric materials, which jam the metal layer in order to increase the adhesion of the metal layer. The peeling phenomenon is eliminated by openings formed in the metal layer to release the stress caused in the following fabricating process.

In addition, the above-described structure is adapted to a device with multi-layered metal layers. The input/output terminals are not restricted in the top layer or in the bottom layer, because every metal layer can be electrically connected to the other metal layer through plugs. That is, input signals or output signals can be introduced in every metal layer and then transmitted to other metal layer.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of a bonding pad for a semiconductor device comprising:
    a substrate;
    an insulation material, formed over the substrate;
    a plurality of first metal layers formed in the insulation material, wherein the first metal layers are separated by the dielectric layer for stress release;
    a plurality of second metal layers formed in the insulation material and above the first metal layers, wherein the second metal layers are separated by the insulation material for stress release;
    a plurality of plugs, formed between the first metal layers and the second metal layers, wherein the plugs are used for connecting the first metal layers with the second metal layers;
    a third metal layer, formed over the dielectric layer; and
    a plurality of second plugs, formed between the second metal layers and the third metal layer, wherein the second plugs are used form connecting the second metal layers with the third metal layer.

2. The structure as claimed in claim 1, wherein the insulation material comprises silicon oxide.

3. The structure as claimed in claim 1, wherein the first metal layers and the second metal layers and the third metal layer comprise aluminum.

4. The structure as claimed in claim 1, wherein the first metal layers and the second metal layers and the third metal layer comprise an alloy of aluminum.

5. The structure as claimed in claim 1, wherein the first metal layers and the second metal layers and the third metal layer comprise an alloy of aluminum and copper.

6. The structure as claimed in claim 1, wherein either the first metal layers, the second metal layers or the third metal layer receives an external signal.

7. The structure as claimed in claimed 6, wherein the external signal is a power signal.

8. The structure as claimed in claimed 6, wherein the external signal is a ground signal.

9. The structure as claimed in claimed 6, wherein the external signal is an input/output signal.

10. A structure of a bonding pad formed on a substrate, wherein an internal circuit is formed in the substrate, the structure comprising:

a dielectric layer, formed over the substrate;

a first metal layer, formed in the dielectric layer, wherein a plurality of first openings are formed in the first metal layer and the first openings are filled with the dielectric layer;

a second metal layer, formed in the dielectric layer and above the first metal layer, wherein a plurality of second openings are formed in the second metal layer and the second openings are filled with the dielectric layer;

a third metal layer, formed over the dielectric layer; and a plurality of second plugs, formed between the second metal layer and the third metal layer, wherein the second plugs are used for connecting the second metal layer with the third metal layer.

11. The structure as claimed in claim 10, wherein the dielectric layer comprises silicon oxide.

12. The structure as claimed in claim 10, wherein the first metal layer, the second metal layer and the third metal layer comprise aluminum.

13. The structure as claimed in claim 10, wherein the first metal layer, the second metal layer and the third metal layer comprise an alloy of aluminum.

14. The structure as claimed in claim 10, wherein the first metal layer, the second metal layer and the third metal layer comprise an alloy of aluminum and copper.

15. The structure as claimed in claim 10, wherein either the first metal layer, the second metal layer or the third metal layer receives an external signal.

16. The structure as claimed in claimed 15, wherein the external signal is a power signal.

17. The structure as claimed in claimed 15, wherein the external signal is a ground signal.

18. The structure as claimed in claimed 15, wherein the external signal is a input/output signal.

19. The structure as claimed in claim 10, wherein the plurality of first openings formed in the first metal layer and filled with the dielectric layer release stress.

* * * * *